US007481295B2

(12) United States Patent
Noro et al.

(10) Patent No.: US 7,481,295 B2
(45) Date of Patent: Jan. 27, 2009

(54) SPEAKER SYSTEM AND SPEAKER ENCLOSURE

(75) Inventors: Masao Noro, Hamamatsu (JP); Akira Arai, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 49 days.

(21) Appl. No.: 11/472,883

(22) Filed: Jun. 21, 2006

(65) Prior Publication Data

US 2007/0000720 A1 Jan. 4, 2007

(30) Foreign Application Priority Data

Jun. 30, 2005 (JP) ............................ 2005-193071

(51) Int. Cl.
*H05K 5/02* (2006.01)
*H04R 1/02* (2006.01)
*H05K 5/06* (2006.01)

(52) U.S. Cl. ...................................... 181/156; 381/349

(58) Field of Classification Search ................. 181/156, 181/155, 199; 381/345, 349, 253, 160, 182, 381/184, 186
See application file for complete search history.

(56) References Cited

U.S. PATENT DOCUMENTS

| | | | | | |
|---|---|---|---|---|---|
| 1,839,714 | A | * | 1/1932 | Tauscher et al. | 181/155 |
| 2,713,396 | A | * | 7/1955 | Tavares | 181/199 |
| 2,834,423 | A | * | 5/1958 | Bradford | 181/156 |
| 3,233,695 | A | * | 2/1966 | Hutchins | 181/156 |
| 3,319,737 | A | * | 5/1967 | Barthel | 181/156 |
| 4,392,548 | A | * | 7/1983 | Bailey | 181/156 |
| 4,598,789 | A | * | 7/1986 | Ritter | 181/144 |
| 4,618,025 | A | * | 10/1986 | Sherman | 181/148 |
| 4,714,133 | A | * | 12/1987 | Skaggs, Jr. | 181/160 |
| 5,150,417 | A | * | 9/1992 | Stahl | 381/349 |
| 5,204,501 | A | * | 4/1993 | Tsao | 181/156 |
| 5,216,210 | A | * | 6/1993 | Kammer | 181/144 |
| 5,731,552 | A | * | 3/1998 | Tsao | 181/156 |
| 5,749,433 | A | * | 5/1998 | Jackson | 181/156 |
| 6,396,936 | B1 | * | 5/2002 | Nevill | 381/349 |
| 7,158,648 | B2 | * | 1/2007 | Butters et al. | 381/160 |
| 2006/0291684 | A1 | * | 12/2006 | Chick et al. | 381/349 |
| 2007/0081687 | A1 | * | 4/2007 | Hayashi | 381/345 |
| 2007/0201712 | A1 | * | 8/2007 | Saiki | 381/186 |
| 2007/0291965 | A1 | * | 12/2007 | Noro et al. | 381/182 |

FOREIGN PATENT DOCUMENTS

| | | | | |
|---|---|---|---|---|
| JP | 45-3826 | | | 2/1970 |
| JP | 53-131325 | | | 11/1978 |
| JP | 04-309096 | | | 10/1992 |
| JP | 04309096 | A | * | 10/1992 |
| JP | 2007110235 | A | * | 4/2007 |

(Continued)

*Primary Examiner*—Edgardo San Martin
(74) *Attorney, Agent, or Firm*—Morrison & Foerster LLP

(57) ABSTRACT

A speaker system, includes a speaker enclosure that has a surface, a speaker that is mounted in the speaker enclosure, a vibration portion that has one end fixed on the surface of the speaker enclosure so as to be allowed to vibrate elastically, an opening portion that is provided in the surface where the vibration portion is provided, and disposed in a position corresponding to a vibration region of the vibration portion and a sealing member that covers a gap formed between the vibration portion and a rim portion of the opening portion while enabling vibration of the vibration portion so as to keep the speaker enclosure airtight.

4 Claims, 15 Drawing Sheets

FOREIGN PATENT DOCUMENTS

| | | | | |
|---|---|---|---|---|
| JP | 2007110236 | A | * | 4/2007 |
| JP | 2007110324 | A | * | 4/2007 |
| JP | 2007129539 | A | * | 5/2007 |
| JP | 2007142874 | A | * | 6/2007 |
| JP | 2007150871 | A | * | 6/2007 |
| JP | 2007194800 | A | * | 8/2007 |
| WO | WO-00/32010 | | | 6/2000 |

* cited by examiner

SPEAKER SYSTEM AND SPEAKER ENCLOSURE

BACKGROUND OF THE INVENTION

The present invention relates to a technique for a speaker system and a speaker enclosure.

Various types of speaker systems have been developed. For example, a bass reflex speaker system or a drawn cone speaker system is a representative of such speaker systems.

"Bass reflex" is a technique for boosting bass by using Helmholtz resonance. "Drawn cone" is a technique for boosting bass by using resonance with air in the volume of an enclosure in which a speaker unit having no drive circuit is mounted.

In "bass reflex", a small-size and slender resonance pipe is required for reducing the resonance frequency if the volume of the enclosure is small. As a result, there is a problem that the bass boosting function is reduced remarkably because air resistance becomes too high. Moreover, there is a problem that wind noise like a whistle is generated because the velocity of air passing through the resonance pipe becomes too high.

In "drawn cone", the mass of the speaker system needs to be increased in order to reduce the resonance frequency. Although compliance of an edge supporting a vibration plate needs to be increased in order to reduce the resonance frequency, the spring characteristic and strength of the edge need to be increased in order to support the vibration plate large in mass. This contradicts the compliance. Moreover, the heavy vibration plate hardly vibrates perfectly in parallel, so that the vibration of the heavy vibration plate is apt to involve abnormal variation called "rolling" or "rocking". The abnormal vibration brings increase in distortion and wasteful consumption of energy to thereby reduce efficiency.

For example, a technique disclosed in WO00/32010 has been proposed for making up the defect of "drawn cone". According to the proposed technique, rolling or rocking can be prevented. The proposed technique, however, has a structure in which the weight of a vibration plate is supported by an edge provided around the vibration plate. For this reason, the edge needs to be strong, so that there is a problem that Q of vibration is reduced because of the damping effect of the edge.

SUMMARY OF THE INVENTION

In order to solve the foregoing problems, an object of the invention is to provide a speaker system and a speaker enclosure in which sufficiently boosted bass can be output though the size of the speaker system or speaker enclosure is small, and in which Q of vibration of a vibration plate can be increased while rolling or rocking can be prevented.

A speaker system according to the invention includes:

a speaker enclosure that has a surface;

a speaker that is mounted in the speaker enclosure;

a vibration portion that has one end fixed on the surface of the speaker enclosure so as to be allowed to vibrate elastically;

an opening portion that is provided in the surface of the speaker enclosure where the vibration portion is provided, and disposed in a position corresponding to a vibration region of the vibration portion; and a sealing member that covers a gap formed between the vibration portion and a rim portion of the opening portion while enabling vibration of the vibration portion so as to keep the speaker enclosure airtight.

Preferably, the speaker is mounted on the surface where the vibration portion and the opening portion are provided.

Preferably, the opening portion is formed in the surface in such a manner that a contour of a plane figure surrounded by a line is cut out while a part of the contour is left, so that a portion corresponding to the plane figure serves as the vibration portion.

A speaker enclosure according to the invention includes:

a main body that has a surface and provided with a speaker mount hole for mounting a speaker;

a vibration portion that has one end fixed on the surface of the main body so as to be allowed to vibrate elastically;

an opening portion that is provided in the surface of the main body where the vibration portion is provided, and disposed in a position corresponding to a vibration region of the vibration portion; and a sealing member that covers a gap formed between the vibration portion and a rim portion of the opening portion while enabling vibration of the vibration portion so as to keep the main body airtight.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Embodiments of the invention will be described below with reference to the drawings.

First Embodiment

Figure 1:
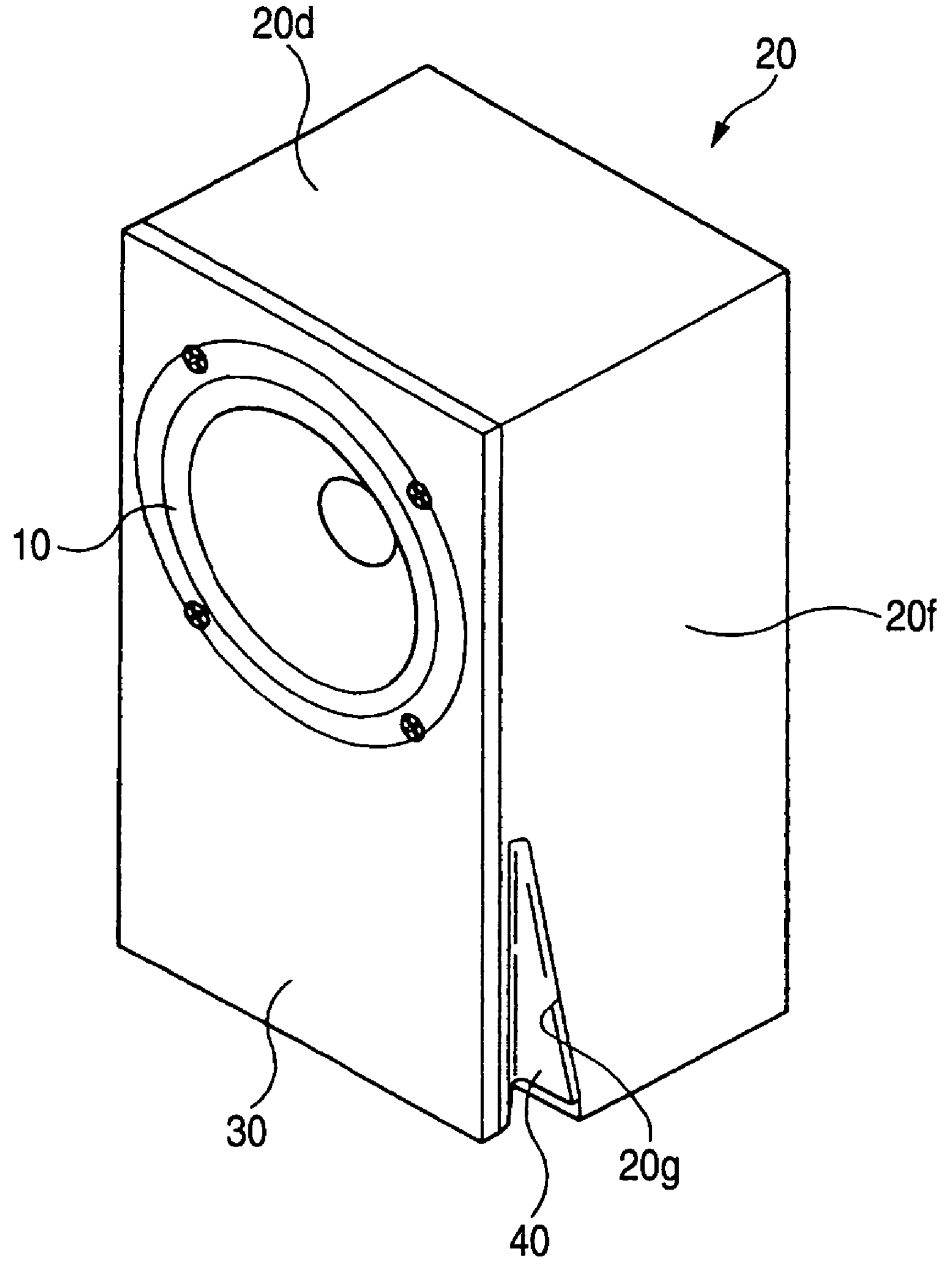
FIG. 1 is a view showing external appearance of a speaker system according to a first embodiment of the invention.
Figure 2A:
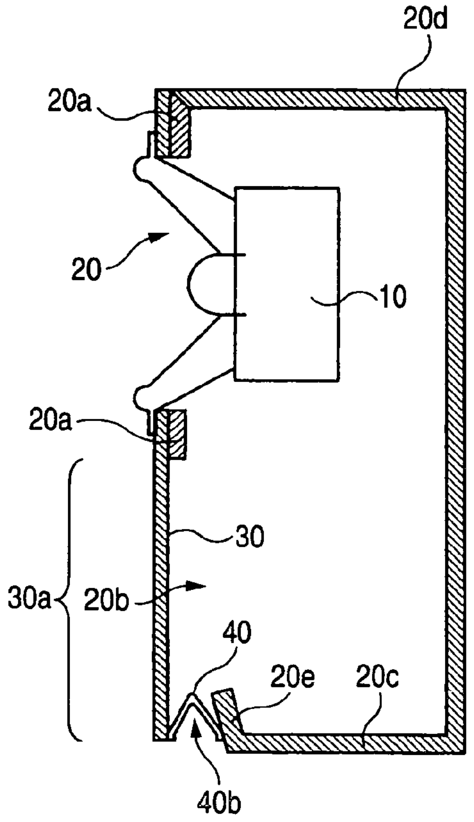
FIGS. 2A and 2B are views showing the internal configuration of this embodiment.
Figure 2B:
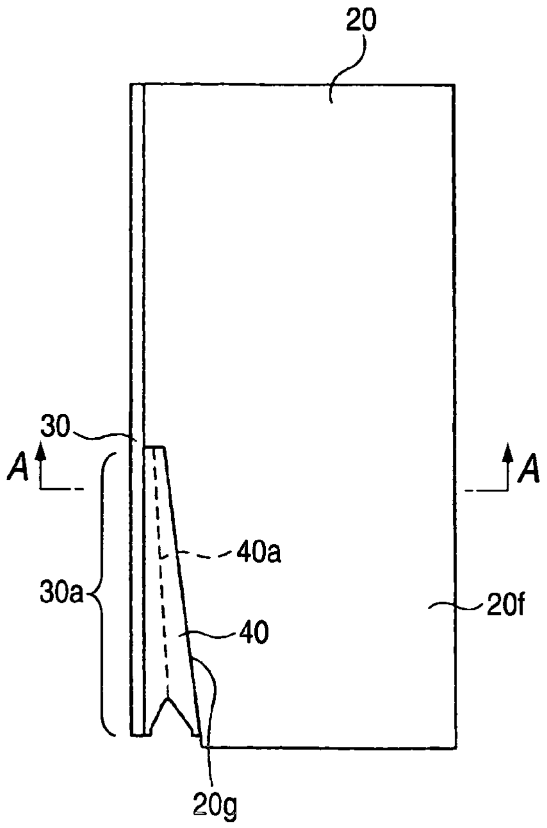

FIG. 1 is a perspective view showing external appearance of a speaker system according to a first embodiment of the invention. FIGS. 2A and 2B are a side sectional view and a side view showing the configuration of the speaker system according to this embodiment.

In FIG. 1, a speaker 10 having a voice coil, a magnet, etc. is mounted in a front surface of a speaker enclosure 20. The speaker enclosure 20 is a rectangular parallelepiped closed type enclosure which has six surfaces each made of a plate-like member (such as wood, synthetic resin, metal or plywood thereof).

As shown in FIG. 2A, a thin plate-like vibration plate 30 is attached to a baffle plate 20*a* in a front surface of the speaker enclosure 20. The vibration plate 30 is formed to have a size equal to the size of the front surface of the speaker enclosure 20 so that the front surface of the speaker enclosure 20 is entirely covered with the vibration plate 30. A speaker mount hole is provided so as to pierce both the vibration plate 30 and the baffle plate 20*a*. The speaker 10 is inserted in the speaker mount hole. In this case, a front frame of the speaker 10 is fixed to the vibration plate 30 and the baffle plate 20*a* by screws.

As shown in FIG. 2A, the baffle plate 20*a* is formed so as to correspond to only an upper half of the front surface of the speaker enclosure 20. A bottom surface 20*c* of the speaker enclosure 20 is formed so as to be slightly shorter than an upper surface 20*d* of the speaker enclosure 20. As shown in FIG. 2A, the front side of the bottom surface 20*c* comes up forward from below to thereby form a front end portion 20*e* extending upward.

As shown in FIGS. 2A and 2B, a front lower portion of each side surface 20*f* of the speaker enclosure 20 is inclined in a range of from a lower end of the baffle plate 20*a* to the front end portion 20*e* of the bottom surface 20*c* to thereby form an inclined portion 20*g*.

A space surrounded by the lower end of the baffle plate 20*a*, the inclined portion 20*g* and an upper edge of the front end portion 20*e* is provided as an opening portion 20*b*. In the aforementioned configuration, the upper portion of the vibration plate 30 is fixed to the baffle plate 20*a* whereas the lower portion of the vibration plate 30 is opposed to the opening portion 20*b*. For this reason, the lower portion of the vibration plate 30 serves as a free end of a cantilever so that the lower portion of the vibration plate 30 can vibrate freely due to elasticity of the vibration plate 30. Hereinafter, the lower portion of the vibration plate 30 will be referred to as "vibration region 30*a*".

In this case, the vibration plate 30 is made of a member having both acoustically sufficient strength and elasticity. The term "acoustically sufficient strength" means that the member is airproof and sufficiently higher in density than air so that the member has sufficient strength and elasticity to generate acoustic wave when the member vibrates. The vibration plate 30 has such a property that a certain degree of acoustic wave can be blocked by the vibration plate 30 itself.

The degree of "elasticity" is such a degree that the vibration plate 30 can be kept substantially horizontal with its own weight supported when the vibration plate 30 is placed horizontally while one side of the vibration plate 30 is fixed. To satisfy this characteristic, the vibration plate 30 is made of a plate-like member such as thin wood, thin synthetic resin, metal or plywood thereof.

The reference numeral 40 designates an edge which is provided between an outer circumferential flange of the vibration region 30*a* of the vibration plate 30 and a rim portion of the opening portion 20*b* for keeping the speaker enclosure 20 airtight. In this case, the edge 40 protrudes toward the inner space of the speaker enclosure 20 between a side edge of the vibration region 30*a* and the inclined portion 20*g* so that a bent portion (hereinafter referred to as "bent 40*a*") of the edge 40 extends vertically. In addition, the edge 40 protrudes toward the inner space of the speaker enclosure 20 between a lower end edge of the vibration region 30*a* and the front end portion 20*e* so that a bent portion (hereinafter referred to as "bent 40*b*") of the edge 40 extends horizontally.

Figure 3:
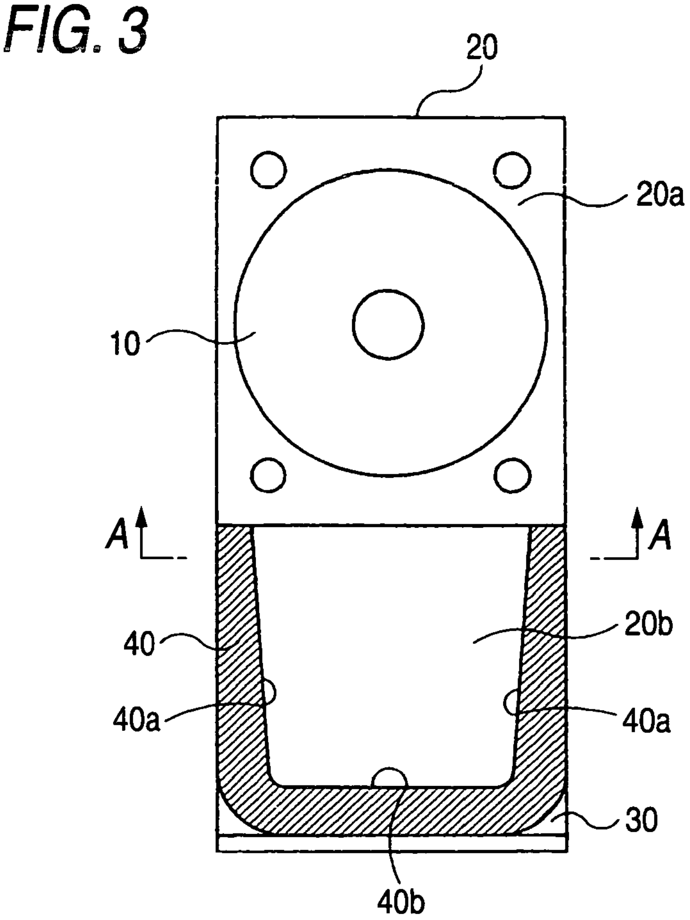
FIG. 3 is a front view showing this embodiment in a state in which a vibration plate is removed.
Figure 4:
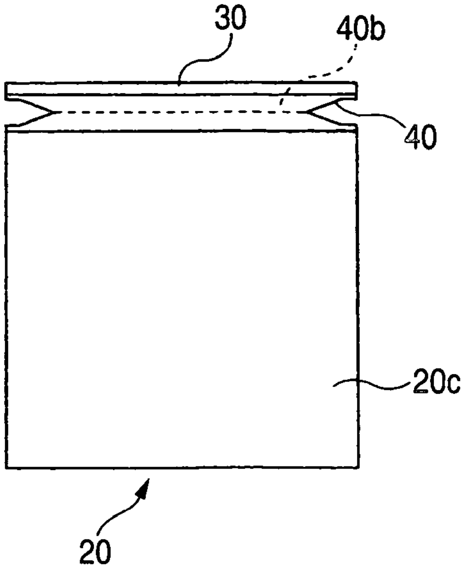
FIG. 4 is a bottom view of this embodiment.
Figure 5:
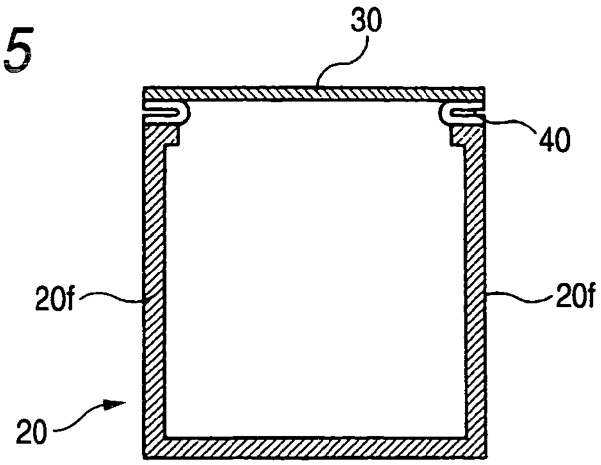
FIG. 5 is a sectional view taken along the line A-A in FIG. 3.

FIG. 3 is a front view of the speaker enclosure 20 in a state where the vibration plate 30 is removed. The hatched portion in FIG. 3 shows the edge 40. Portions of the edge 40 protruding toward the inner space of the speaker enclosure 20 are bents 40*a* and 40*b*. FIG. 4 is a bottom view of the speaker enclosure 20. FIG. 5 is a sectional view taken along the line A-A in FIG. 3.

The outer circumferential flange portion of the edge 40 shown in FIG. 3 is bonded to an outer circumferential edge portion of the vibration region 30*a* of the vibration plate 30 to thereby keep the speaker enclosure 20 airtight. The bents 40*a* and 40*b* of the edge 40 can be bent freely, so that the vibration region 30*a* can vibrate freely without disturbance. Though not shown in FIGS. 2A and 2B, a speaker terminal connected to the voice coil of the speaker 10 is provided in the rear surface of the speaker enclosure 20.

In the above configuration, when the speaker 10 is driven, vibration of cone paper of the speaker 10 is propagated to air in the speaker enclosure 20 so that the vibration region 30*a* of the vibration plate 30 vibrates in accordance with vibration of the air. On this occasion, the vibration plate 30 vibrating while the speaker enclosure 20 is kept airtight by the edge 40 compresses or expands the volume of the air in the speaker enclosure 20 when the vibration plate 30 vibrates. Accordingly, a new resonance frequency is provided between compliance (mechanical flexibility) based on air spring characteristic of the speaker enclosure 20 in addition to elasticity of the vibration plate 30 and equivalent mass of the vibration plate 30. As a result, sound is reproduced with the resonance frequency of the vibration plate 30 as its center.

The air spring and the elasticity (spring characteristic) of the vibration plate 30 work equivalently as if two springs were connected in parallel to each other. The resonance frequency of the vibration plate 30 as the resonance frequency of the speaker system is however substantially determined on the basis of the compliance of the air and the equivalent mass of the vibration plate 30 because the compliance of the air spring is smaller than the compliance of the spring function of the vibration plate 30.

The resonance frequency determined thus can be easily set to a desired value in a bass region. When, for example, a speaker having an effective diameter of 8 cm, a minimum resonance frequency of 70 Hz and Q of 0.35 is used as the speaker 10 while the inner volume of the speaker enclosure 20 is set to 3.5 liters, a resonance frequency of 50 Hz can be obtained as the resonance frequency of the vibration plate if the mass of the vibration plate 30 is 135 grams.

Figure 6A:
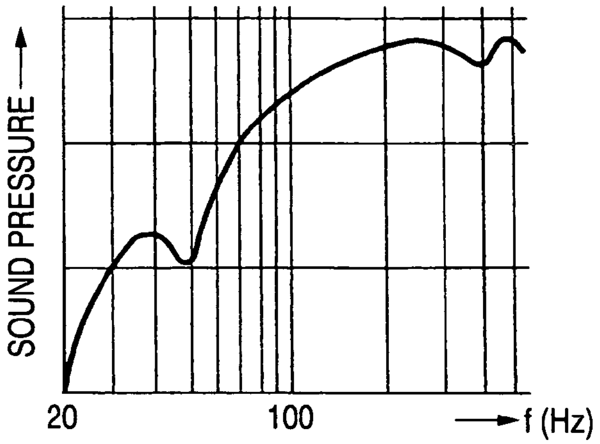
FIGS. 6A and 6B are graphs showing frequency characteristic of this embodiment.
Figure 6B:
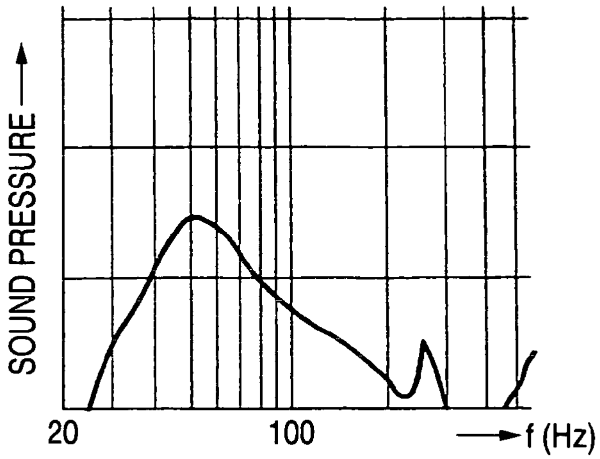

FIG. 6A shows frequency characteristic of the speaker 10 in the aforementioned specific example. FIG. 6B shows frequency characteristic of the vibration plate 30 in the aforementioned specific example. As is obvious from FIGS. 6A and 6B, bass with emphasized frequencies near 50 Hz can be output intensively when the aforementioned numerical values are set in this embodiment. In this manner, in this embodiment, the function of a passive radiator such as a drawn cone can be obtained by use of flexural vibration of the vibration plate 30.

The vibration region 30*a* reproduces bass in a primary vibration mode in which the vibration region 30*a* vibrates while bent as a whole like a "paper fan". This is because the vibration plate 30 is entirely driven by air though secondary and tertiary vibration modes and higher-order vibration modes are present in the vibration plate 30, so that the level of occurrence of the primary vibration mode becomes the highest whereas the levels of occurrence of other vibration modes become low. To suppress the higher-order modes more sufficiently, adjustment can be made by the material and thickness of the vibration plate 30 or lamination of materials.

Incidentally, in this embodiment, the vibration plate 30 can be kept horizontal by itself even in the case where the vibration plate 30 is placed horizontally because the vibration plate 30 has elasticity enough to support its own weight. Although elasticity of the vibration plate 30 itself serves as compliance of free resonance, the loss at vibration is sufficiently small because the inner loss of the vibration plate 30 having elasticity is far smaller than the inner loss of the edge 40 having elasticity of the same degree.

In this embodiment, the material of the edge 40 can be made softer than the material of the edge used in a drawn cone in the background art. Moreover, the edge 40 need not have mechanical strength. In the background-art passive radiator such as a drawn cone, the edge has the two functions of supporting the vibration plate and keeping the speaker enclosure airtight because the passive radiator needs a structure in which the rigid vibration plate is supported by the edge. In this embodiment, however, the edge 40 need not have any support function because the function of supporting the vibration plate 30 is given to the vibration plate 30 itself. For this reason, a soft material which could not be used in the background art can be used as the material of the edge 40 as long as the speaker enclosure 20 can be kept airtight. A situation that the vibration of the vibration plate 30 is not disturbed can be formed, so that Q of vibration can be increased.

The resonance frequency of the vibration plate 30 can be reduced when the mass of the vibration plate 30 is increased. That is, the resonance frequency can be adjusted in accordance with the size, material, etc. of the vibration plate 30. The resonance frequency can be also easily adjusted when a certain member is stuck to the vibration plate 30.

Figure 7:
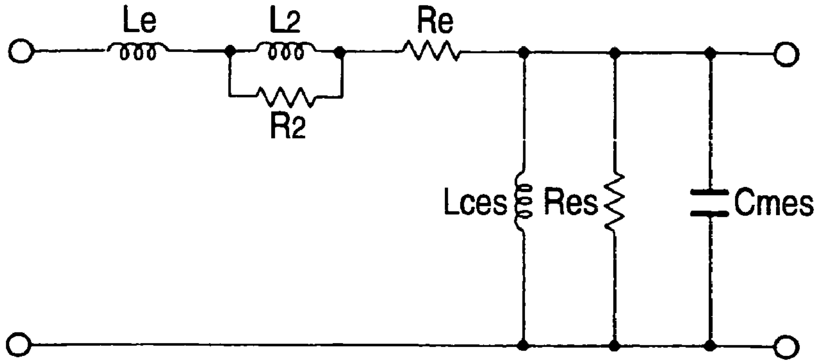
FIG. 7 is an electrically equivalent circuit of a speaker.

The difference between the invention and the background art will be described in connection with equivalent circuits. FIG. 7 shows an electrically equivalent circuit of the speaker. The electrically equivalent circuit has a configuration in which a low-frequency resonance circuit (resonance frequency=F0) composed of Cmes, Res and Lces is voltage-driven through voice coil impedance.

In FIG. 7, the reference symbols are as follows.

Re=voice coil DC resistance

Le, L2, R2=high-frequency impedance increasing factors

Cmes=equivalent mass capacitance of the speaker vibration system

Lces=equivalent compliance inductance of the speaker vibration system

Res=mechanical damping resistance of the speaker vibration system

Figure 8:
FIG. 8 is an electrically equivalent circuit of a speaker enclosure.

FIG. 8 shows an equivalent circuit of the speaker enclosure. In FIG. 8, the reference symbol Lve designates equivalent volume inductance.

Figure 9:
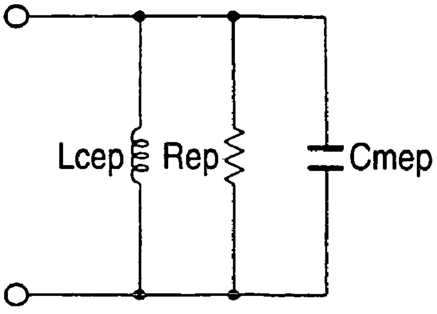
FIG. 9 is an equivalent circuit of a background-art passive radiator.

FIG. 9 shows an equivalent circuit of the background-art passive radiator such as a drawn cone or a hinge-fixed vibration plate. As shown in FIG. 9, the equivalent circuit has a circuit configuration in which the factor of the voice coil is removed from the speaker. Mass Cmep is supported by compliance Lcep and damping resistance Rep of the edge.

In FIG. 9, the reference symbols are as follows.

Cmep=equivalent mass capacitance of the passive radiator

Lcep=equivalent compliance inductance of the passive radiator

Rep=mechanical damping resistance of the passive radiator

Figure 10:
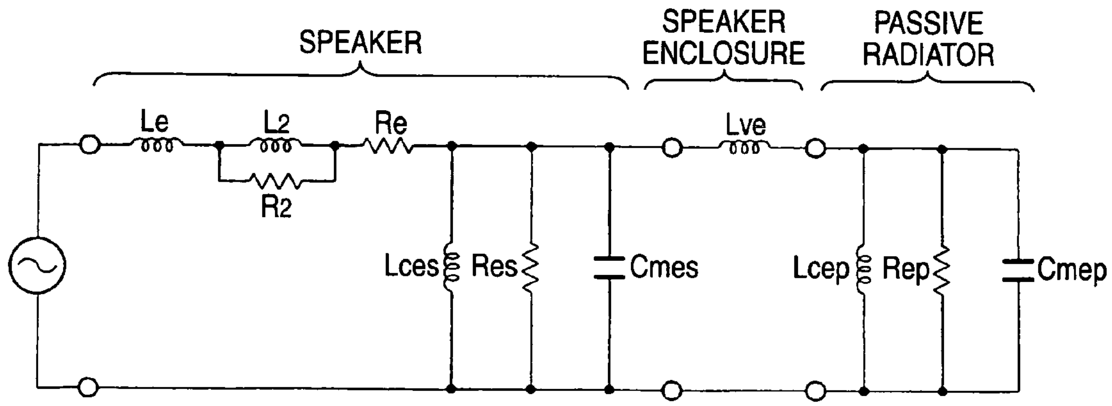
FIG. 10 is an equivalent circuit of a background-art passive radiator system.

FIG. 10 shows an equivalent circuit of the background-art passive radiator system. An acoustic output of the speaker driven by a signal voltage drives the passive radiator through the volume of the speaker enclosure.

The low-frequency resonance frequency of the system is substantially equal to the resonance frequency of Cmep and Lve. To reduce the resonance frequency through the small volume, it is necessary to increase Cmep. This means that the passive radiator becomes heavy. To support the heavy passive radiator, the edge needs to be durable and strong. On the other hand, because flexibility is required of the edge, a soft material such as rubber or urethane is used as the material of the edge. It is therefore necessary to thicken the edge in order to increase the strength. Thickening the edge, however, means increasing damping force as well as reducing the equivalent compliance Lcep (i.e. reducing the resistance value Rep in terms of expression in the electrically equivalent circuit). For this reason, the loss of the passive radiator becomes so large that bass reproducibility is reduced.

Figure 11:
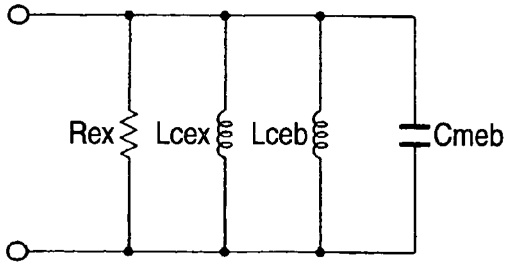
FIG. 11 is an equivalent circuit of a vibration plate in the invention.

FIG. 11 shows an equivalent circuit of the vibration plate according to the invention. Because a side of the vibration plate is entirely fixed, the vibration plate itself has compliance Lceb to support its own weight. Because the vibration plate is made of an elastic substance, the resistance component such as the edge material can be ignored. Because the edge need not support the weight of the vibration plate, a thin material can be used as the material of the edge. Accordingly, compliance Lcex can be increased to a very large value, so that the loss can be reduced to a very small value necessarily (i.e. damping resistance Rex can be increased to a large value in terms of expression in the electrically equivalent circuit).

In FIG. 11, the reference symbols are as follows.

Cmeb=equivalent mass capacitance of the vibration plate

Lceb=equivalent compliance inductance of the vibration plate

Lcex=equivalent compliance inductance of the vibration plate edge

Rex=mechanical damping resistance of the vibration plate edge

Figure 12:
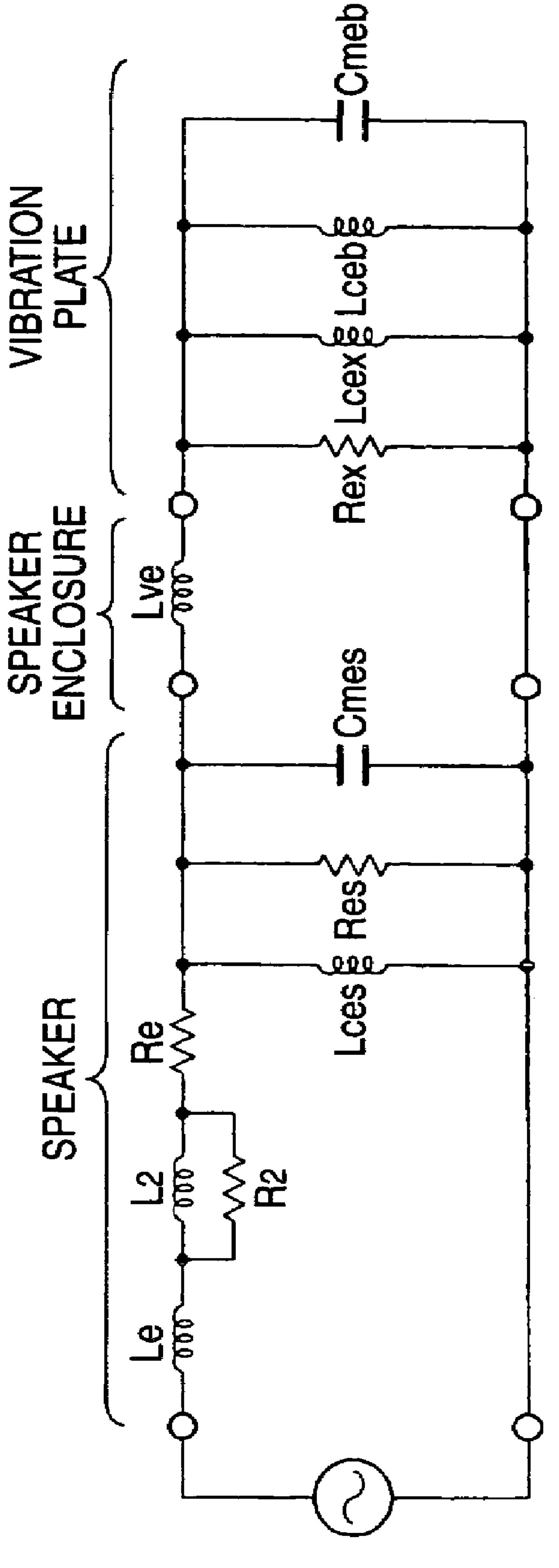
FIG. 12 is an equivalent circuit of a speaker system in the invention.

FIG. 12 shows an equivalent circuit of the speaker system according to the invention. In comparison with FIG. 10, when the speaker and the volume of the speaker enclosure are the same as those in FIG. 10, the low-frequency resonance frequency is made equal to that in FIG. 10 if the following relation holds.

Cmep=Cmeb

Although the same compliance is required as compliance to support the weight of the vibration plate, the compliance becomes substantially equal to Lceb because of Lcep in FIG. 10 and Lcex>>Lceb in FIG. 12. When an appropriate design is made, the following relation substantially holds.

Lcep=Lceb

There is no large difference between FIG. 10 and FIG. 12 in the factors described above. As is obvious from the above description, the important characteristic of the invention is however to satisfy the following relation.

Rex>>Rep

It is therefore to be understood that the loss is reduced greatly to bring an advantage in bass reproduction compared with the background-art system.

Second Embodiment

Figure 13:
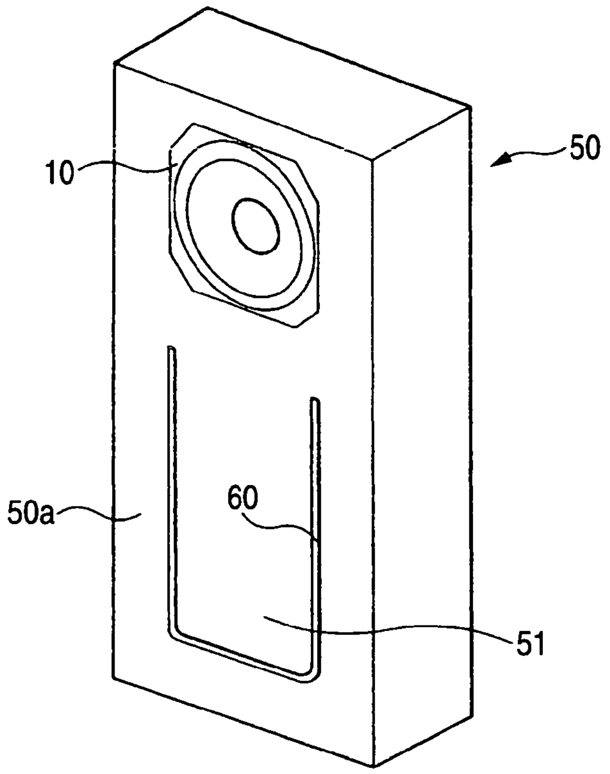
FIG. 13 is a perspective view showing external appearance of a speaker system according to a second embodiment of the invention.

Next, a second embodiment of the invention will be described. FIG. 13 is a perspective view showing external appearance of the second embodiment of the invention. In FIG. 13, a speaker 10 is mounted in an upper portion of a baffle plate 50*a* in a front surface of a rectangular parallelepiped speaker enclosure 50. An opening portion 60 cut away as a narrow and long U-shaped portion is provided in a range of from a center portion of the baffle plate 50*a* to a lower portion of the baffle plate 50*a*.

In this case, the inner portion of the U-shaped portion serves as a vibration plate 51. That is, an upper portion of the vibration plate 51 is integrated with the baffle plate 50*a* while the other portion of the vibration plate 51 is separated from the baffle plate 50*a* by the U-shaped opening portion 60. Accordingly, the vibration plate 51 can vibrate freely in a state where the upper end of the vibration plate 51 is fixed.

Figure 14A:
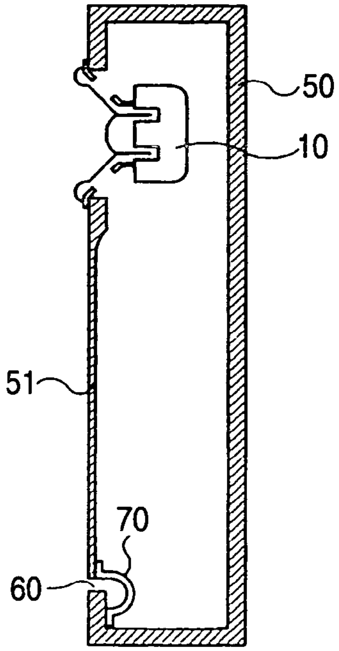
FIGS. 14A and 14B are views showing the internal structure of this embodiment.
Figure 14B:
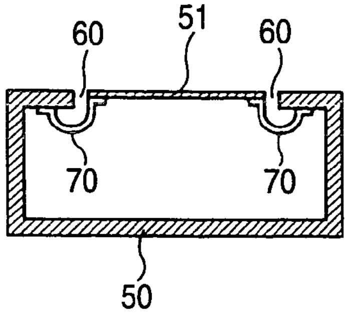
Figure 15:
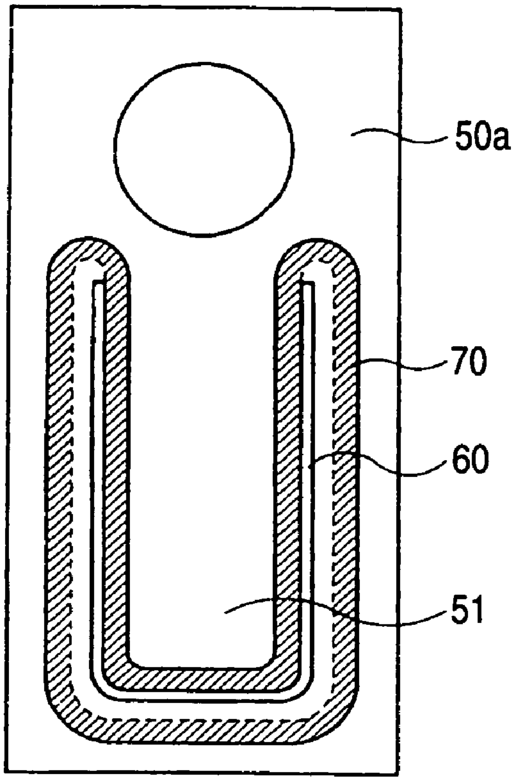
FIG. 15 is a rear view of a baffle plate 50*a* in this embodiment.

FIGS. 14A and 14B are a side sectional view and a cross-sectional view showing this embodiment. As shown in FIGS. 14A and 14B, the opening portion 60 is covered with an edge 70 shaped like an arch in sectional view, from the inside of the speaker enclosure 50. As a result, the speaker enclosure is kept airtight. FIG. 15 is a rear view of the baffle plate 50*a*. As shown in FIG. 15, the edge 70 covers the U-shaped opening portion 60 along the shape thereof.

In this embodiment, the vibration plate 51 itself has a support function because a side of the vibration plate 51 is provided as a fixed end connected to the baffle plate 50*a*. For this reason, the edge 70 need not support the weight of the vibration plate 51 as long as the edge 70 has the function of keeping the speaker enclosure airtight. Accordingly, a soft material can be used as the material of the edge 70. As a result, a situation that vibration of the vibration plate 51 is not prevented, that is, a situation that the vibration plate 51 can move easily, can be formed. The operation of this embodiment is the same as that of the first embodiment in that a frequency band (bass band) near the resonance frequency of the vibration plate 51 is boosted.

Figure 16:
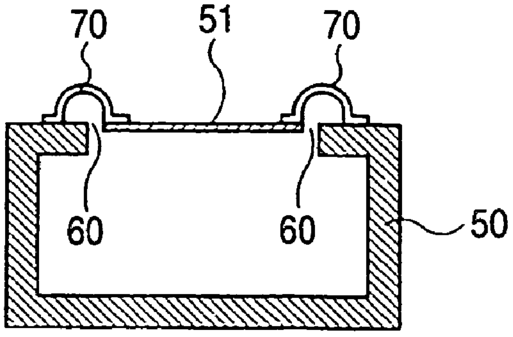
FIG. 16 is a view showing a modification of this embodiment.

Although this embodiment has been described upon the case where the opening portion 60 is covered with the edge 70 from the inside of the speaker enclosure 50, the opening portion 60 may be covered with the edge 70 from the outside of the speaker enclosure 50 as shown in FIG. 16. Incidentally, FIG. 16 is a cross-sectional view corresponding to FIG. 14B.

Although the second embodiment has been described upon the case where the opening portion is provided in a speaker-provision surface of the speaker enclosure to thereby form the vibration plate, the position where the vibration plate is formed (i.e. the opening portion is provided) is not limited thereto. Any position may be used as long as the position is in a wall surface of the speaker enclosure.

Figure 17A:
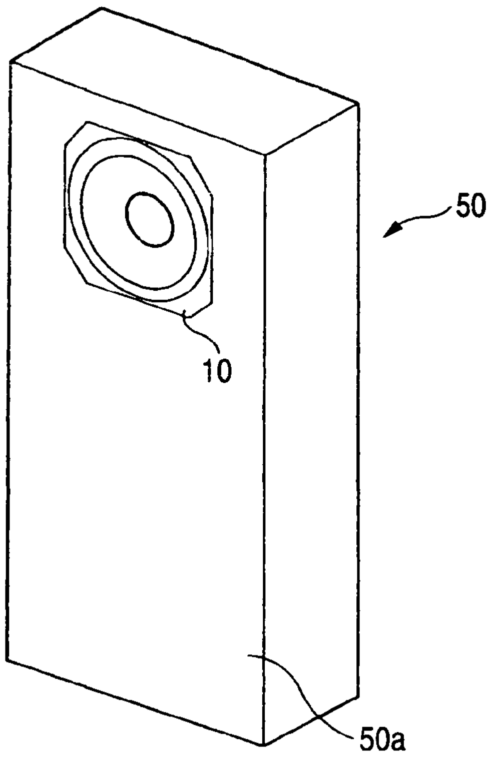
FIGS. 17A to 17C are views showing another modification of this embodiment.
Figure 17B:
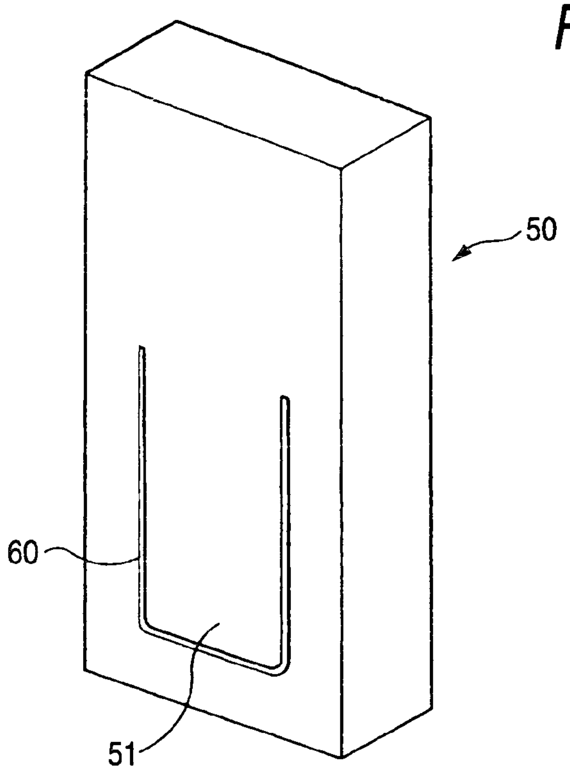
Figure 17C:
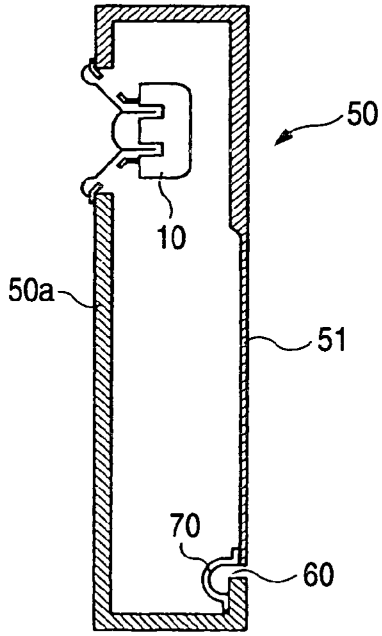

FIGS. 17A to 17C are views showing an example of the position where the vibration plate is formed. FIG. 17A is a perspective view showing external appearance of a speaker system. FIG. 17B is a perspective view of the modified example from the rear. FIG. 17C is a side sectional view. As shown in FIGS. 17A to 17C, in this example, an opening portion 60 is provided in a surface opposite to a baffle plate 50*a*, that is, in the rear surface of a speaker enclosure 50.

<Modifications>

Although embodiments of the invention have been described above, the invention is not limited to the embodiments and various modifications may be made. Examples of such modifications will be described below.

Figure 18A:
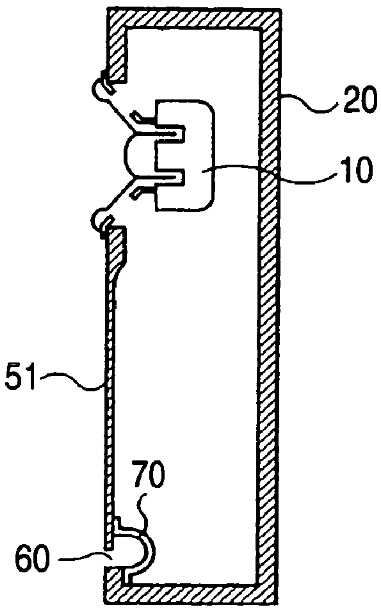
FIGS. 18A and 18B are views showing a further embodiment of the invention.
Figure 18B:
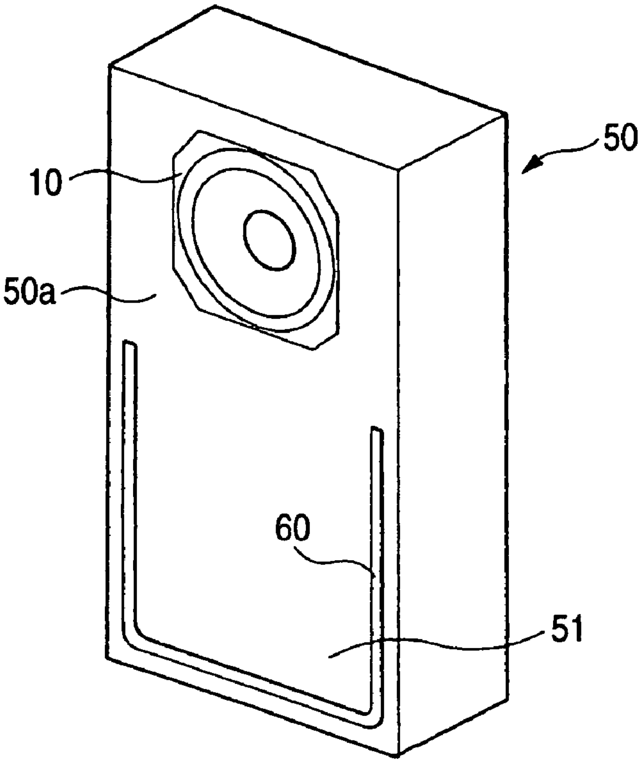

(1) When a slender opening portion is formed as described in the second embodiment, the shape of the opening portion is not limited to the U-shape. In brief, on the assumption of a plane figure surrounded by lines in an arbitrary surface of the speaker enclosure, the opening portion can be formed in such a manner that the contour of the plane figure is cut out while a part of the contour of the plane figure is left as it is. When the opening portion is formed in this manner, a portion corresponding to the plane figure serves as the vibration plate. FIG. 18B shows external appearance of a speaker system. For example, the opening portion 60 may be formed so that the whole lower portion of the baffle plate 50*a* is formed as the vibration plate 51 as shown in FIG. 18B. FIG. 18A is a side sectional view in this case.

Figure 19C:
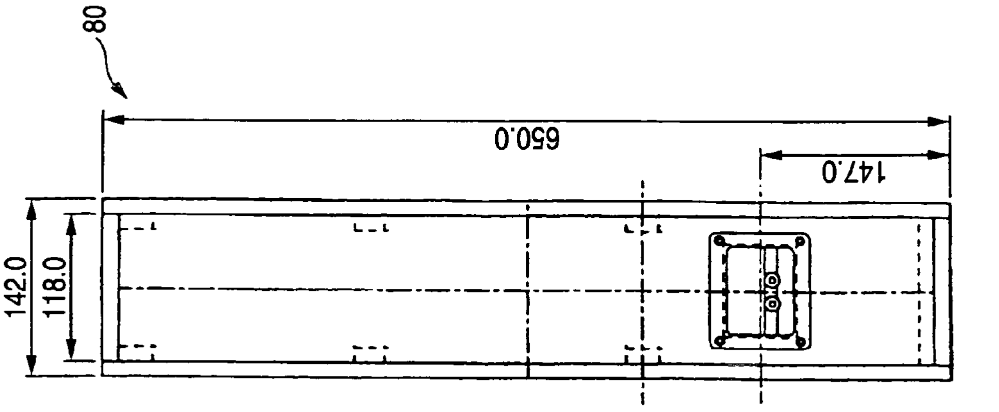
FIGS. 19A to 19C are views showing a further embodiment of the invention.
Figure 19B:
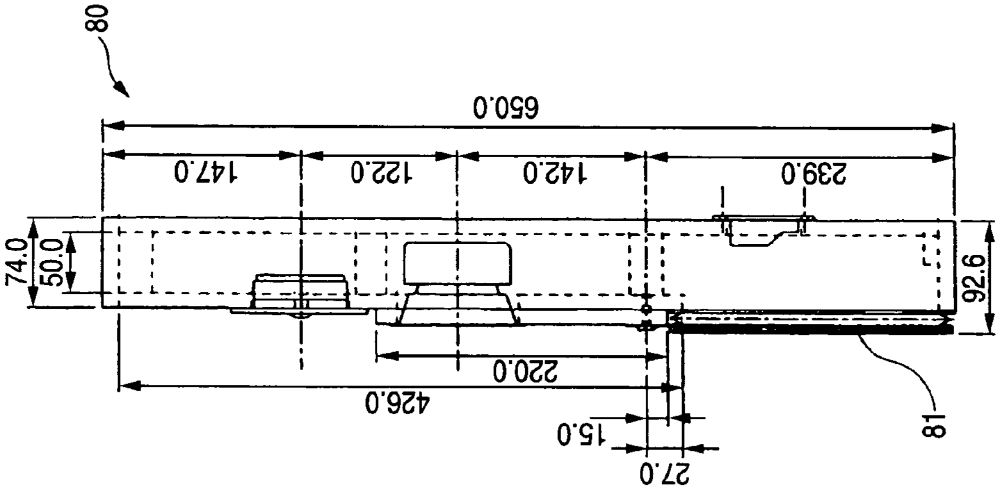
Figure 19A:
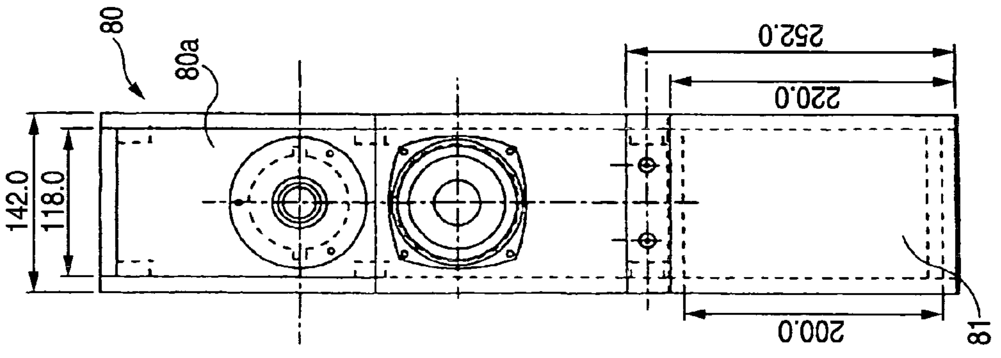

(2) FIGS. 19A to 19C show an example in which a tweeter and a woofer are mounted in a baffle plate 80*a* of a vertically long speaker enclosure 80 while a vibration plate 81 is formed under the baffle plate 80*a*. FIG. 19A is a front view. FIG. 19B is a side sectional view. FIG. 19C is a rear view. In the example shown in FIGS. 19A to 19C, when a speaker with an effective diameter of 8 cm and a minimum resonance frequency of 70 Hz is housed in a speaker enclosure with an inner volume of 3.5 litters while the resonance frequency of the vibration plate is adjusted to 50 Hz, bass from 40 Hz (−10 dB) can be reproduced.

Figure 20B:
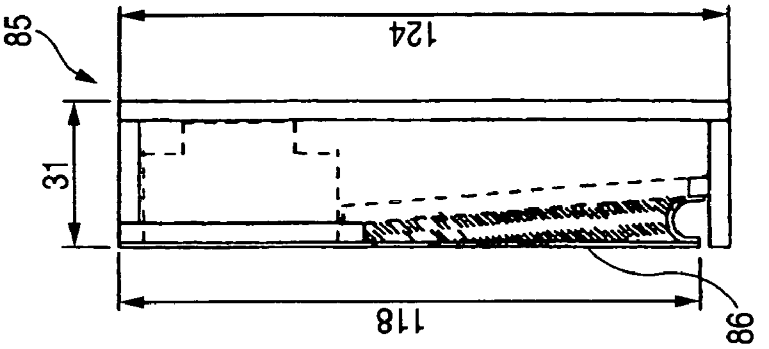
FIGS. 20A and 20B are views showing a further embodiment of the invention.
Figure 20A:
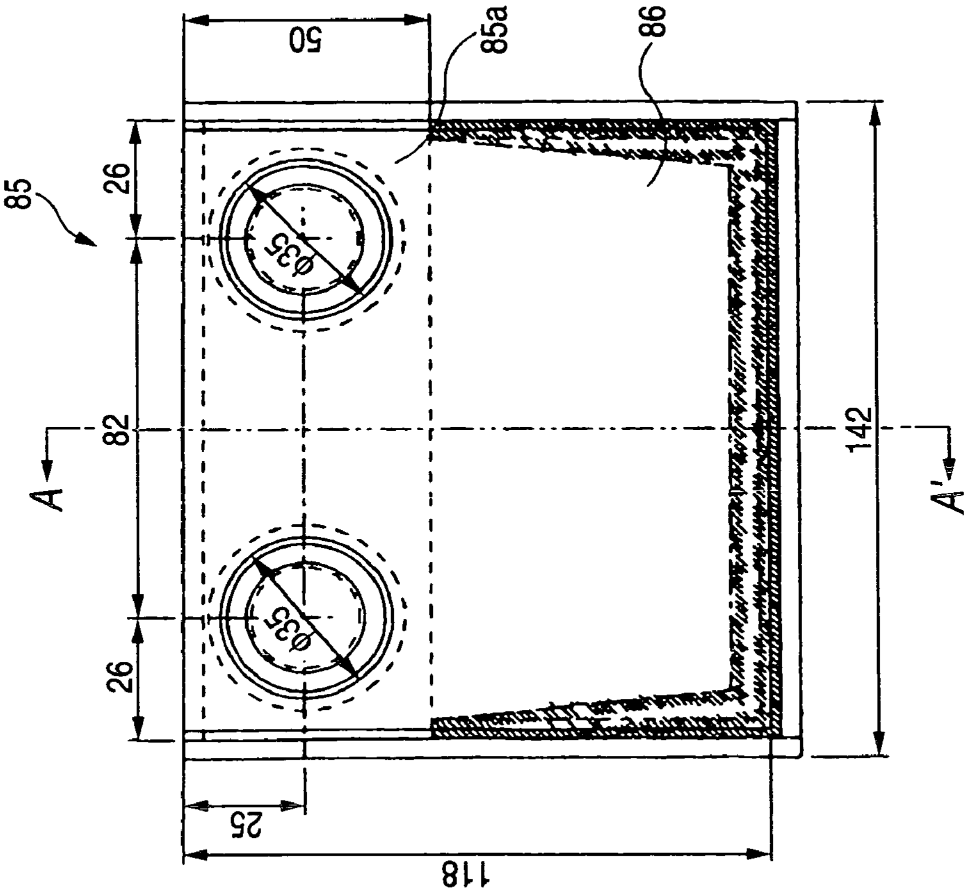

(3) FIGS. 20A and 20B show an example in which two speakers are mounted horizontally in a baffle plate 85*a* of a speaker enclosure 85 while a lower portion of the baffle plate 85*a* is formed as a vibration plate 86. FIG. 20A is a front view. FIG. 20B is a sectional view taken along the line A-A in FIG. 20A. In the example shown in FIGS. 20A and 20B, when two speakers with an effective diameter of 3 cm and a minimum resonance frequency of 190 Hz are housed in a speaker enclosure with an inner volume of 400 cc while the resonance frequency of the vibration plate is adjusted to 120 Hz, bass from 100 Hz (−10 dB) can be reproduced.

Figure 21B:
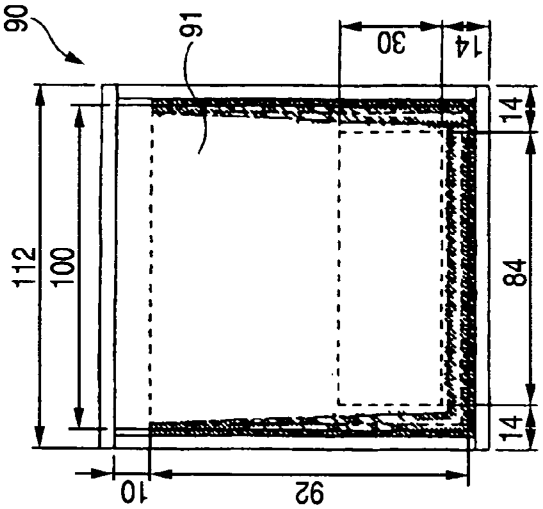
FIGS. 21A to 21D are views showing a further embodiment of the invention.
Figure 21D:
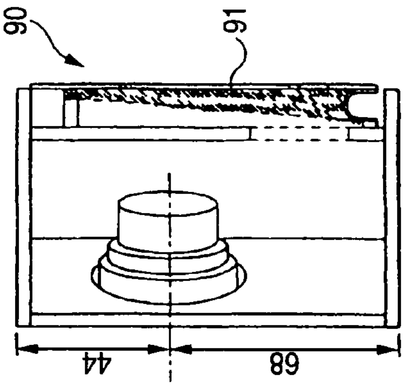
Figure 21A:
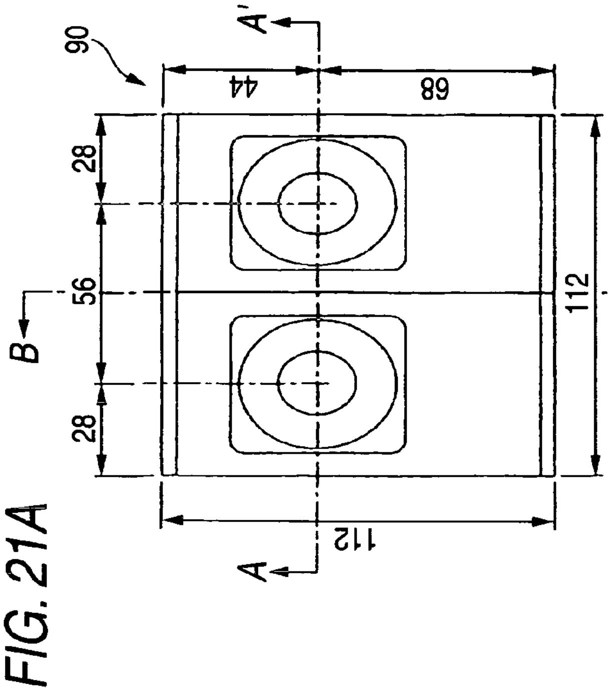
Figure 21C:
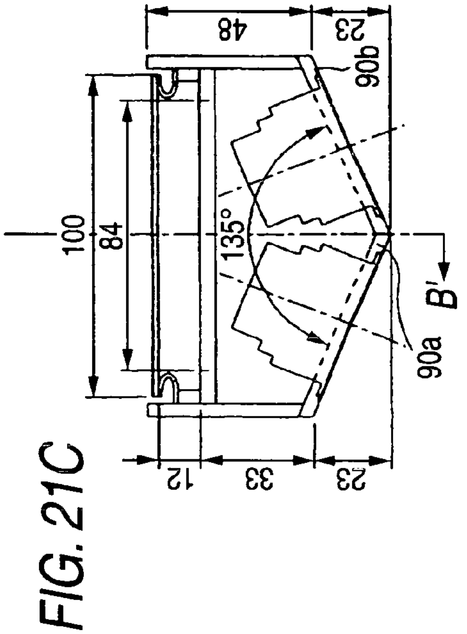

(4) FIGS. 21A to 21D show an example in which two speakers are mounted in two baffle plates 90*a* and 90*b* connected at an angle, respectively, while a vibration plate 91 is formed in a rear surface of a speaker enclosure 90. FIG. 21A is a front view. FIG. 21B is a rear view. FIG. 21C is a sectional view taken along the line A-A in FIG. 21A. FIG. 21D is a sectional view taken along the line B-B in FIG. 21C. In the example shown in FIGS. 21A to 21D, when two speakers with an effective diameter of 3 cm and a minimum resonance frequency of 190 Hz are housed in a speaker enclosure with an inner volume of 400 cc while the resonance frequency of the vibration plate is adjusted to 120 Hz, bass from 100 Hz (−10 dB) can be reproduced.

Figure 22C:
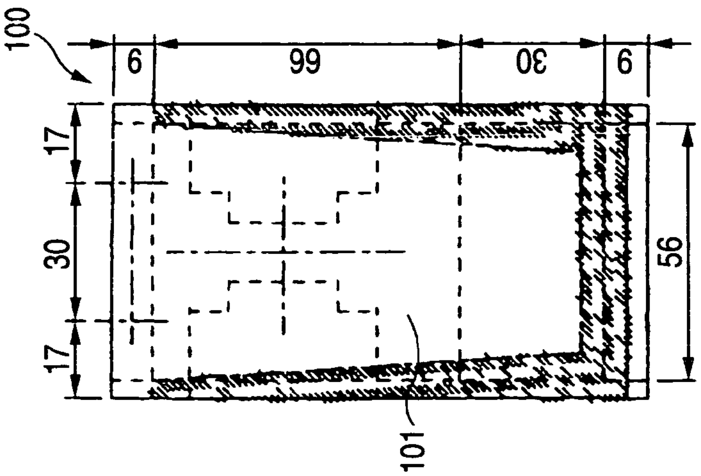
FIGS. 22A to 22C are views showing a further embodiment of the invention.
Figure 22B:
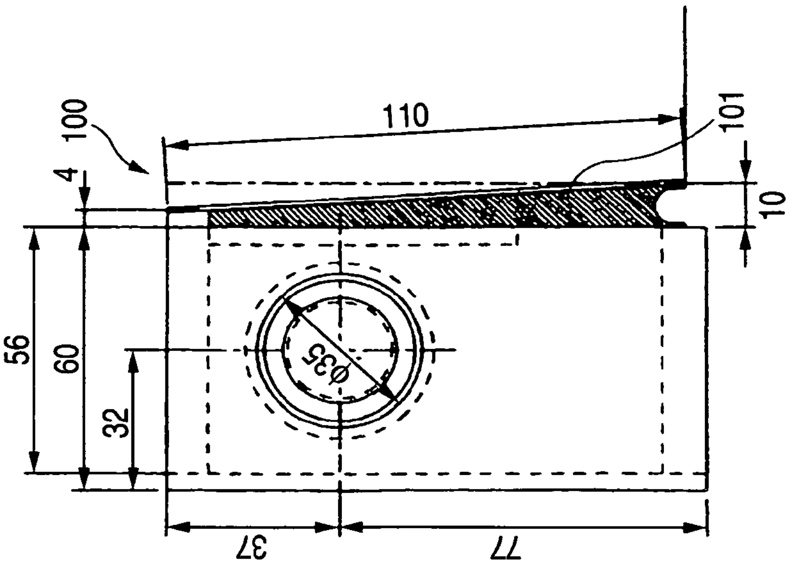
Figure 22A:
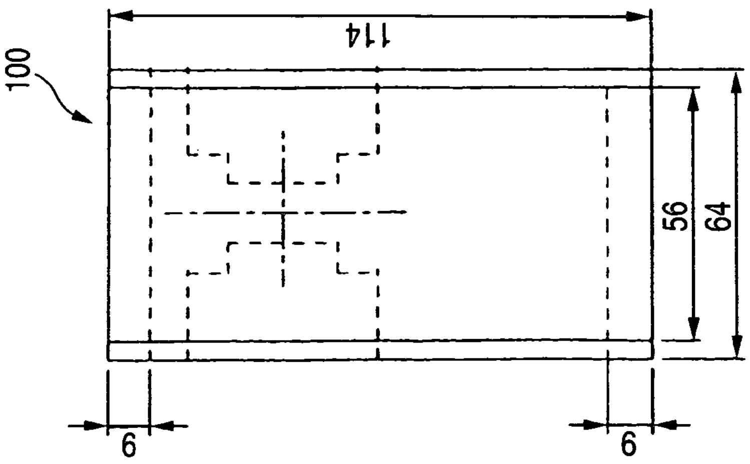

(5) FIGS. 22A to 22C show an example in which two speakers are mounted in left and right side surfaces of a speaker enclosure 100, respectively, while a vibration plate 101 is formed in a front surface of the speaker enclosure 100. FIG. 22A is a rear view. FIG. 22B is a side view. FIG. 22C is a front view. In the example shown in FIGS. 22A to 22C, when two speakers with an effective diameter of 3 cm and a minimum resonance frequency of 190 Hz are housed in a speaker enclosure with an inner volume of 300 cc while the resonance frequency of the vibration plate is adjusted to 120 Hz, bass from 100 Hz (−10 dB) can be reproduced.

(6) As shown in each of the aforementioned embodiments, the opening portion is provided in a position corresponding to the vibration region of the vibration plate. That is, the opening portion may be provided on the back of the vibration plate or around the vibration plate so that the vibration plate can vibrate.

The present application is based on Japan Patent Application No. 2005-193071 filed on Jun. 30, 2005, the contents of which are incorporated herein for reference.

What is claimed is:

1. A speaker system, comprising:

a speaker enclosure that has a surface;

a speaker that is mounted in the speaker enclosure;

a vibration portion that has one end securely fixed on the surface of the speaker enclosure so as to be allowed to vibrate elastically;

an opening portion that is provided in the surface of the speaker enclosure where the vibration portion is provided, and disposed in a position corresponding to a vibration region of the vibration portion; and a sealing member that covers a gap formed between the vibration portion and a rim portion of the opening portion while enabling vibration of the vibration portion so as to keep the speaker enclosure airtight.

2. The speaker system according to claim 1, wherein the speaker is mounted on the surface where the vibration portion and the opening portion are provided.

3. The speaker system according to claim 1, wherein the opening portion is formed in the surface in such a manner that a contour of a plane figure surrounded by a line is cut out while a part of the contour is left, so that a portion corresponding to the plane figure serves as the vibration portion.

4. A closed speaker enclosure, comprising:

a main body that has a surface and provided with a speaker mount hole for mounting a speaker;

a vibration portion that has one end securely fixed on the surface of the main body so as to be allowed to vibrate elastically;

an opening portion that is provided in the surface of the main body where the vibration portion is provided, and disposed in a position corresponding to a vibration region of the vibration portion; and a sealing member that covers a gap formed between the vibration portion and a rim portion of the opening portion while enabling vibration of the vibration portion so as to keep the main body airtight.

* * * * *